United States Patent
Kawabata et al.

(10) Patent No.: US 9,472,428 B2
(45) Date of Patent: Oct. 18, 2016

(54) MANUFACTURING METHOD OF MODULE COMPONENTS

(71) Applicant: TDK Corporation, Tokyo (JP)

(72) Inventors: Kenichi Kawabata, Tokyo (JP); Seiko Komatsu, Tokyo (JP)

(73) Assignee: TDK CORPORATION, Tokyo (JP)

( * ) Notice: Subject to any disclaimer, the term of this patent is extended or adjusted under 35 U.S.C. 154(b) by 312 days.

(21) Appl. No.: 14/334,965

(22) Filed: Jul. 18, 2014

(65) Prior Publication Data

US 2015/0052743 A1 Feb. 26, 2015

(30) Foreign Application Priority Data

Aug. 26, 2013 (JP) ................. 2013-174118

(51) Int. Cl.
*H01L 21/58* (2006.01)
*H01L 21/67* (2006.01)

(52) U.S. Cl.
CPC .... *H01L 21/67092* (2013.01); *Y10T 29/49124* (2015.01)

(58) Field of Classification Search
CPC .............. H01L 21/67092; Y10T 29/49124
See application file for complete search history.

(56) References Cited

U.S. PATENT DOCUMENTS

| | | | | |
|---|---|---|---|---|
| 5,160,403 A | * | 11/1992 | Fisher | .................... B41J 2/1604 156/257 |
| 2004/0252475 A1 | | 12/2004 | Tsuneoka et al. | |
| 2005/0051358 A1 | | 3/2005 | Kawamoto et al. | |
| 2007/0014523 A1 | * | 1/2007 | Ohtsu | .................. G02B 6/1221 385/89 |
| 2008/0299744 A1 | * | 12/2008 | Yamazaki | ......... H01L 21/76254 438/458 |
| 2009/0090928 A1 | * | 4/2009 | Mori | .................. H01L 25/0753 257/99 |
| 2009/0166896 A1 | * | 7/2009 | Yamazaki | ......... H01L 21/76254 257/787 |
| 2011/0006106 A1 | | 1/2011 | Kanryo et al. | |
| 2012/0247658 A1 | * | 10/2012 | Kawada | .............. C03B 33/0222 156/250 |

FOREIGN PATENT DOCUMENTS

| | | |
|---|---|---|
| JP | 2004-095607 | 3/2004 |
| JP | 2004-103998 | 4/2004 |
| JP | 2004-172176 | 6/2004 |
| JP | 2004-193187 | 7/2004 |
| JP | 2004-207352 | 7/2004 |
| JP | 2005-079139 | 3/2005 |
| JP | 4530110 | 8/2010 |
| WO | 2009/119374 A1 | 10/2009 |

\* cited by examiner

*Primary Examiner* — Carl Arbes
(74) *Attorney, Agent, or Firm* — Young Law Firm, P.C.

(57) ABSTRACT

A manufacturing method of electronic module components according to the present invention includes: forming a plurality of module components on a principal surface of a substrate; forming a groove by dicing between the module components; spraying a conductive paste toward the principal surface of the substrate; and separating the module components. The spraying is performed so that an angle formed between a spray direction and the principal surface is an angle θ. The angle θ is set so as to satisfy the following expression (1), assuming that a depth of the groove is D and a width of the groove is w. The expression (1) is $$\tan^{-1}(D/2w) \le \theta \le \tan^{-1}(2D/w)$$

8 Claims, 7 Drawing Sheets

MANUFACTURING METHOD OF MODULE COMPONENTS

BACKGROUND OF THE INVENTION

1. Field of the Invention

The present invention relates to a manufacturing method of module components, and more particularly relates to a manufacturing method of electronic module components including a self-shielding structure.

2. Description of Related Art

Various electronic module components are mounted on a smartphone and a tablet terminal that are recently in widespread use. These module components include, as basic constituent elements, a substrate with various wiring lines formed on a surface or inside thereof and a connection pad and a terminal formed on a bottom surface thereof, a passive device (an inductor, a capacitor, or the like) and a semiconductor device respectively mounted on the surface of the substrate, and a mold that covers the passive device and the semiconductor device. Among these, there is a module component further including a so-called self-shielding structure in which respective surfaces other than a terminal surface are covered with a conductive paste, and a ground potential is supplied to the conductive paste thereby enabling shielding from electromagnetic noise. Examples of such module components are disclosed in Japanese Patent Application Laid-open Nos. 2004-172176, 2004-095607, 2004-103998, 2004-207352, 2004-193187, and 2005-079139, and Japanese Patent No. 4530110.

Supply of the ground potential to the conductive paste is realized by exposing a ground wiring line, which is one of the various wiring lines formed on the substrate, on a side surface of the module component. By this method, electrical continuity is established between the conductive paste formed on the side surface of the module component and the ground wiring line exposed on the side surface, thereby enabling to supply the ground potential to the conductive paste.

The self-shielding structure can be formed by various methods as disclosed in the above seven patent documents. However, a method of applying a conductive paste by spraying as disclosed in Patent Application Laid-open No. 2005-079139 is currently considered to be most preferable. According to this method, a conductive paste with fewer bubbles as compared to other methods can be obtained.

When a conductive paste is formed by spray application in a mass production process of module components, a groove is formed by dicing between a plurality of module components formed on one panel or sheet (hereinafter, "aggregate substrate"), and a conductive paste is sprayed toward inside of the groove.

According to the conventional manufacturing method, spraying of the conductive paste as described above is performed by spraying the conductive paste directly downward from a spray nozzle provided immediately above the groove. According to this method, when the groove is shallow, the conductive paste can be formed preferably over the entire internal side surface of the groove. Therefore, the conductive paste can be formed preferably over the entire upper surface and side surface of the module component.

However, when the groove is deep, even when the conductive paste is sprayed as described above, the conductive paste may adhere only to an upper part of the internal side surface of the groove, and may not reach the lower part thereof. In this case, formation of the conductive paste becomes insufficient on the side surface of the module component, particularly in the lower part thereof (a part close to a terminal surface). According to the degree thereof, an electromagnetic shielding function may be deteriorated and electrical continuity between the ground wiring lines formed in the substrate and the conductive paste say be lost.

SUMMARY

In view of the above problems, an object of the present invention is to provide a manufacturing method of module components in which a conductive paste can be preferably formed on a side surface of a module component by spray application in a mass production process.

In order to solve the above problems, a manufacturing method of electronic module components according to one aspect of the present invention includes: forming a plurality of module components on a principal surface of a substrate; forming a groove by dicing between the module components; spraying a conductive paste toward the principal surface of the substrate; and separating the module components, wherein the spraying is performed so that an angle formed between a spray direction and the principal surface is an angle $\theta$, and wherein the angle $\theta$ is set so as to satisfy the following expression (1), assuming that a depth of the groove is D and a width of the groove is w.

$$\tan^{-1}(D/2w) \leq \theta \leq \tan^{-1}(2D/w) \qquad (1)$$

According to the above aspect of the present invention, because the conductive paste is sprayed at an angle with respect to the groove, the conductive paste can also reach a lower part of an internal side surface of the groove. Accordingly, the conductive paste can be preferably formed on the side surface of the module component by spray application in a mass production process.

In the manufacturing method of module components, the spraying step of the conductive paste can include a step of spraying the conductive paste toward a first internal side surface of the groove, and a step of spraying the conductive paste toward a second internal side surface of the groove opposite to the first internal side surface. Accordingly, the conductive paste can be preferably formed on the side surfaces of two module components positioned on opposite sides of the groove.

In the manufacturing method of module components, the module components respectively have a ground wiring line including an end exposed on a lower part of the side surface, and the conductive paste can be electrically connected to the ground wiring line through the end. Alternatively, the module components respectively have four side surfaces, and the ground wiring line can be formed so as to be exposed on at least one of the four side surfaces of the corresponding module component. Accordingly, a ground potential can be supplied to the conductive paste.

In the manufacturing method of module components, a step of adhering a dicing tape onto a rear surface of the aggregate substrate can be provided before the forming step of the groove, and the separating step can be a step of detaching the module components from the dicing tape. Accordingly, the conductive paste can foe formed even in the lowermost part of the side surface of each module component (a margin on a side of the terminal surface).

On the other hand, in the manufacturing method of module components, at the forming step of the groove, a part of the aggregate substrate can be left in an uncut state and the dicing can be performed so that the ground wiring line is exposed on the internal side surface of the groove. The separating step can be a step of cutting the part of the aggregate substrate that has not been cut at the forming step of the groove. Accordingly, the spraying step of the conductive paste can be performed without using an adhesive sheet such as the dicing tape for holding the shape of the aggregate substrate.

In the manufacturing method of module components, at the spraying step of the conductive paste, the conductive paste can be sprayed intermittently by pulse control. Accordingly, a requisite minimum thickness can be obtained, and a difference in the thickness of the conductive paste between an upper surface and a side surface of the module component can be suppressed.

According to the present invention, the conductive paste can be preferably formed on the side surface of the module component by spray application in a mass production process.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 5A shows a conventional relation (spray angle θ=90°), FIG. 5B shows an end of a preferred range of the spray direction in the present invention (spray angle θ=tan$^{-1}$(2D/w)), and FIG. 5C shows the other end of the preferred range of the spray direction in the present invention (spray angle θ=tan$^{-1}$(D/2w));

DETAILED DESCRIPTION OF THE EMBODIMENTS

Preferred embodiments of the present invention will now be explained in detail with reference to the drawings.

Figure 1:
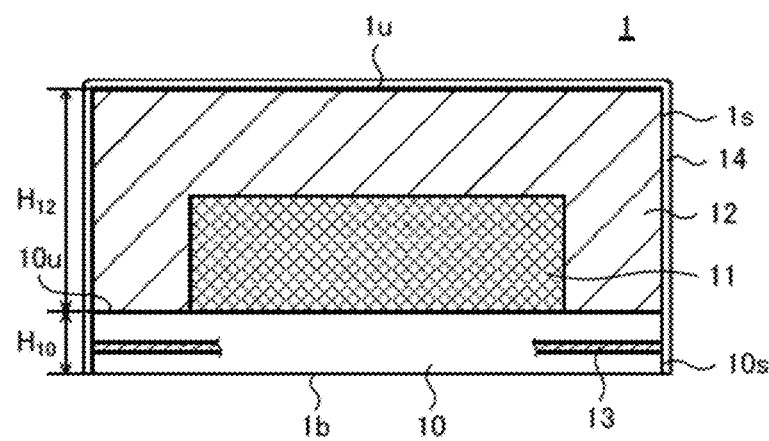
FIG. 1 is a cross section of a module component manufactured by a manufacturing process of module components according to an embodiment of the present invention.

A structure of a module component 1 manufactured by a manufacturing method of module components according to the present embodiment is explained first with reference to FIG. 1.

The module component 1 is a cuboidal electronic component mounted on an electronic device such as a smartphone and a tablet terminal, and includes, as shown in FIG. 1, a substrate 10, a chip component 11 placed on an upper surface 10u of the substrate 10, a mold 12 that covers the entire upper surface 10u of the substrate 10 from above the chip component 11, and a shield 14 that covers an entire upper surface 1u and side surface 1s of the module component 1.

The substrate 10 is cut out from one large aggregate substrate by dicing performed in a manufacturing process of the module component 1 described later. As a specific constituent material of the substrate 10, an organic substrate, an LTCC (low-temperature calcination multilayer ceramic substrate), an HTCC (high-temperature calcination multilayer ceramic substrate), flexible printed board, and the like are preferable. The substrate 10 can incorporate various active devices and various passive devices. A thickness $H_{10}$ of the substrate is determined as a result of selecting the number of layers and the thickness according to a required function, a circuit size, a required shape, and the like. However, in most cases, the thickness $H_{10}$ of the substrate in a module component for a smartphone and a tablet terminal that require thinning of the module is often 0.05 to 0.5 mm.

Various wiring lines including a ground wiring line 13 shown in FIG. 1 are formed at least on one of the inside and the upper surface 10u of the substrate 10. These wiring lines can be formed by metal such as copper, silver, gold, nickel, chromium, aluminum, palladium, and indium, an alloy of these metal, or a material using resin or glass as a binder. However, it is most preferable to form the wiring line by copper or silver in view of cost and conductivity. The wiring line can be formed by a method such as printing, plating, stamping, sputtering, vapor deposition, ink-jet, or etching. As shown in FIG. 1, an end of the ground wiring line 13 is exposed to the side surface 1s of the module component 1. A connection pad connected to the wiring line is also formed on the upper surface 10u of the substrate 10.

Although not shown, a plurality of external terminals are formed on a rear surface (a lower surface 1b of the module component 1) of the substrate 10. These external terminals are connected to the various wiring lines in the substrate 10, and function as an input/output terminal of the chip component 11 and a power supply terminal that receives supply of a power potential (including a ground potential) from outside. The module component 1 is mounted on a motherboard (not shown), and the external terminals formed on the lower surface 1b are electrically connected with the wiring lines on the motherboard.

The chip component 11 is a component or a circuit device required for the functions of the module. For example, the chip component 11 is an active device such as a memory, a processor, an RF control IC, a power-supply control IC, a transistor, or a diode, a passive device such as a capacitor, an inductor, a register, or a filter, a crystal oscillator, or an MEMS device. Many terminal electrodes (not shown) are exposed on the lower surface thereof. These terminal electrodes are bonded with the connection pad formed on the upper surface 10u of the substrate 10 by a method such as printing of cream solder, reflow, or printing and curing of the conductive paste.

The mold 12 is formed by a material using a thermosetting or thermoplastic material as a base, and blended with an appropriate amount of filler. A blending amount of the filler is set so that thermal expansion coefficients of the substrate 10 and the mold 12 become a value adjusted to reduce warpage during reflow, thereby enabling to reliably perform mounting on and bonding to the motherboard. The mold 12 can be formed by a method of compression, injection, printing, cast molding, or the like. A thickness $H_{12}$ of the mold 12 can be appropriately selected according to the thickness of the chip component 11.

The mold 12 is formed to cover the entire upper surface 10u of the substrate 10 from above the chip component 11. The upper surface of the mold 12 is flattened to form the upper surface 1u of the module component 1. A side surface of the mold 12 is a surface cut by dicing described later, and forms a surface flush with a side surface 10s of the substrate 10. The side surface 1s of the module component 1 is formed of a side surface of the mold 12 and the side surface 10s of the substrate 10. Specifically, the side surface of the mold 12 forms an upper part of the side surface 1s (a part from the upper surface 1u downward by a distance $H_{12}$), and the side surface 10s of the substrate 10 forms a lower part of the side surface 1s (a part from the lower surface 1b upward by a distance $H_{10}$).

The shield 14 is made of a material in which a filler made of gold, silver, copper, tin, nickel, or the like is dispersed and mixed in thermosetting resin or thermoplastic resin, a nano paste in which a filler having a nano size is dispersed in a solvent, or a material in which two or more kinds of fillers described above are mixed or blended. Regarding the material and the paste, viscosity can be adjusted by adding a solvent in which one or more kinds of solvents having a boiling point between 50° C. and 300° C. are mixed, as a diluting solvent.

As shown in FIG. 1, the shield 14 is formed to entirely cover the upper surface 1u and the side surface 1s of the module component 1. Because the end of the ground wiring line 13 is exposed on the side surface 1s of the module component 1, electrical continuity is established between the shield 14 and the ground wiring line 13 (these are electrically connected with each other). As a result, the potential of the shield 14 is the ground potential, and thus the shield 14 has a function of shielding electromagnetic noise coming from outside to the module component 1.

Figure 2:
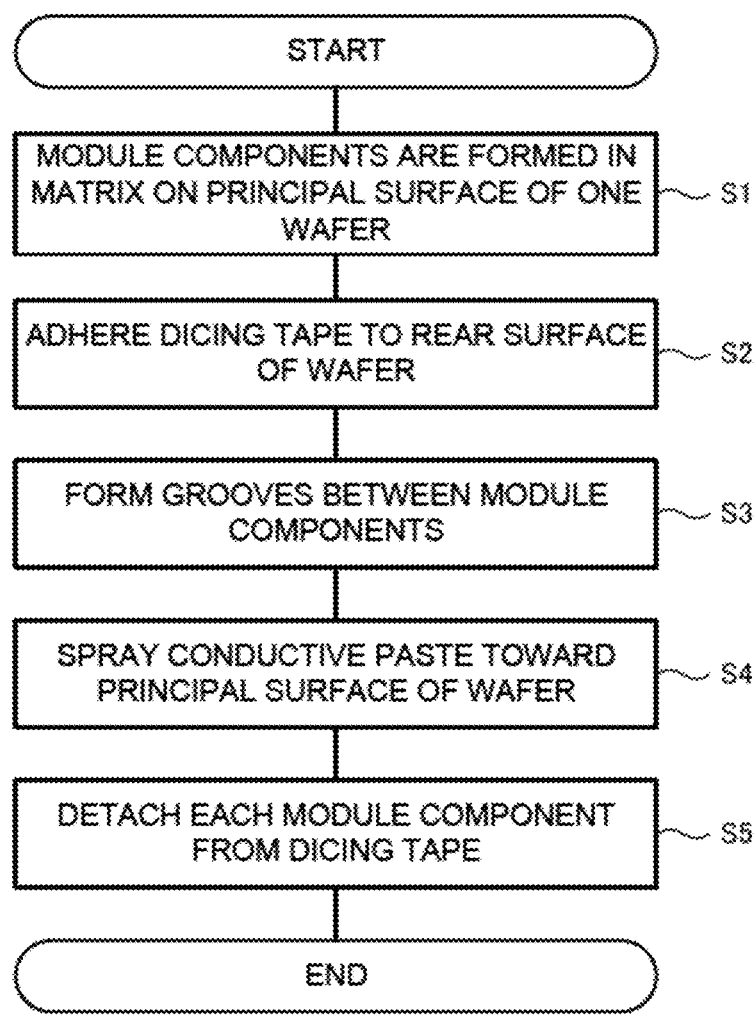
FIG. 2 is a flowchart of the manufacturing process of module components according to the embodiment.

The manufacturing method of module components according to the present embodiment is explained in detail with reference also to a flowchart in FIG. 2, taking a case of manufacturing the module component 1 shown in FIG. 1 as an example. In the following explanations, an overall concept of the manufacturing method of module components is explained first, and then characteristic parts of the present invention are explained in detail.

According to the manufacturing method, a plurality of module components 1 are first formed in a matrix on one aggregate substrate (not shown) (Step S1). Specifically, necessary wiring lines are formed inside and on a principal surface of the aggregate substrate, and necessary terminal electrodes are formed on the rear surface of the aggregate substrate. Necessary chip components 11 are mounted on the principal surface of the aggregate substrate and the entire principal surface is covered with the mold 12.

Figure 3:
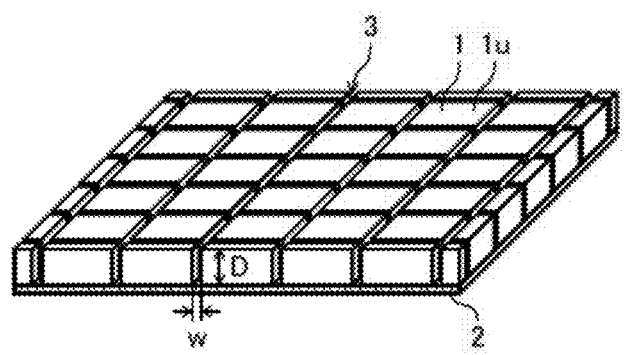
FIG. 3 is an overhead view of the module components in an aggregate substrate state.

A dicing tape is adhered to the rear surface of the aggregate substrate (Step S2). By performing dicing using a dicer in this state, as shown in FIG. 3, grooves 3 are formed between the module components 1 (Step S3). Dicing is performed from the side of the principal surface of the aggregate substrate so that the mold 12 and the aggregate substrate (the substrate 10) are completely separated for each module component 1, but the dicing tape is not cut out. Accordingly, the dicing tape is exposed on the bottom surface of the groove 3, and the side surfaces 1s of the respective module components 1 are exposed on the internal side surface of the groove 3. Because the dicing tape is not cut out, a relative positional relation of the respective module components 1 does not change before and after the dicing.

A depth D of the groove 3 formed in the manner described above becomes substantially equal to the sum total of the thickness $H_{12}$ of the mold 12 and the thickness $H_{10}$ of the substrate shown in FIG. 1. A set value of the depth D in the dicer can be appropriately selected according to the height of the chip component 11 and the thickness $H_{10}$ of the substrate 10. However, generally, the set value is approximately between 0.5 mm to 1.4 mm. A width w of the groove 3 depends on a width of a blade of the dicer. However, it is preferable to decrease the width w as much as possible by using a blade as thin as possible in terms of using the area of the aggregate substrate efficiently. The minimum value of the width w is different according to the value of the depth D, however, it is approximately 0.2 mm to 0.4 mm. The range of an aspect ratio (=D/w) of the groove 3 is calculated as 1.25 to 7 based on these values.

An example in which the aggregate substrate is completely cut (full cut) by using the dicing tape is explained here. However, a portion of the aggregate substrate at a certain distance from the rear surface thereof can be left without being diced (half cut). In this case, the dicing tape is not necessarily used. When the dicing tape is not used, it is necessary to set the thickness of the portion left uncut so that the portion left uncut is not easily broken. Specifically, it is preferable to leave a portion of about 0.02 mm to 0.20 mm left uncut.

Figure 4A:
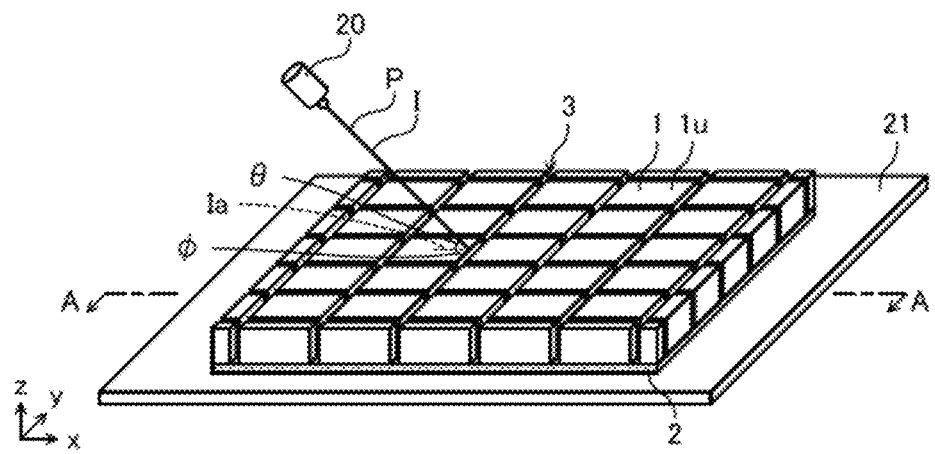
FIG. 4A is an overhead view showing a spraying step of a conductive paste.
Figure 4B:
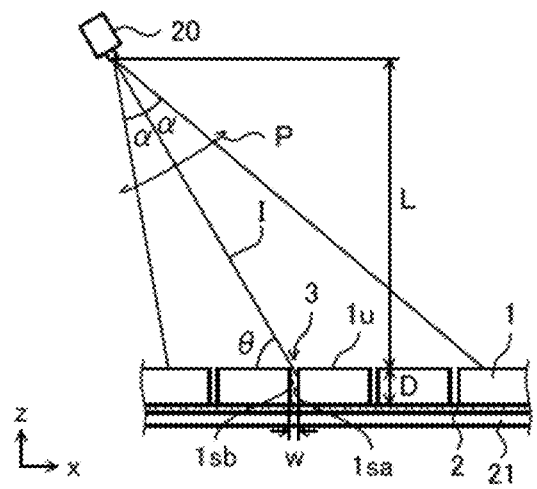
FIG. 4B is a cross section cut along line A-A in FIG. 4A.

The conductive paste is then sprayed toward the principal surface of the aggregate substrate (the upper surface 1u of the respective module components) (Step S4). Specifically, as shown in FIGS. 4A and 4B, a spray nozzle 20 is installed at a distance L from the upper surface 1u, and the conductive paste P is sprayed from the spray nozzle 20 toward the principal surface of the aggregate substrate. The spray direction I shown in FIGS. 4A and 4B indicates the center of flow of the conductive paste P sprayed from the spray nozzle 20. As shown in FIG. 4B, the actual flow of the conductive paste P has a certain extent of dispersion from the spray direction I (spray angle 2α≠0).

Spraying of the conductive paste P is explained below in detail. Spray is performed in a state where the aggregate substrate formed with the module components 1 is installed on a work table 21 corresponding to parallel movement and rotational movement on a horizontal plane. The spray nozzle 20 is fixed above the work table 21 so that an angle formed between the spray direction I and the upper surface of the work table 21 becomes an angle θ.

In the following explanations, it is assumed that a normal direction of the work table 21 is a s direction, and directions parallel to the surface of the work table 21 are an x direction and a y direction. The x direction is an extending direction of a projection Ia of the spray direction I of the spray nozzle 20 into an xy plane, and the y direction is at a right angle to the x direction. As the work table 21, a table corresponding to at least the parallel movements in the x direction and the y direction and the rotational movement in the xy plane is used.

Spraying of the conductive paste P is performed toward the groove 3 as a target, while moving the work table 21. Specifically, the work table 21 is moved first and the groove 3 as a target is arranged parallel to the y direction. Accordingly, the projection Ia ox the spray direction I into the xy plane and the width direction of the groove 3 as a target become parallel to each other. That is, an angle φ formed between the extending direction of the groove 3 and the projection Ia becomes a right angle. However, it can be formed so that the angle φ is not the right angle, and the angle θ in this case is defined by an angle formed between the projection of the spray direction I into the xy plane and the upper surface of the work table.

The work table 21 is then translated on the xy plane so that an end of the spray direction I enters into the groove 3 as a target. Subsequently, spraying of the conductive paste P is started, and the work table 21 is moved in the y direction at a certain speed, while spraying the conductive paste P. Accordingly, a thin film of the conductive paste P is formed on an internal side surface on a side away from the spray nozzle 20 (an internal side surface 1sa shown in FIG. 4B), of the opposite internal side surfaces in the width direction of the groove 3 as a target. When the angle θ is a sharp angle, the conductive paste P hardly adheres to the internal side surface on a side close to the spray nozzle 20 (an internal side surface 1sb shown in FIG. 4B).

The spraying process described above is sequentially performed for each internal side surface in the width direction of all the grooves 3. Specifically, the groove 3 shown in FIG. 4B is explained below as an example. The conductive paste P is sprayed while the work table 21 is moved in the y direction in a state where the spray nozzle 20 is directed toward the internal side surface 1sa (the first internal side surface). Accordingly, a thin film of the conductive paste P is formed on the internal side surface 1sa. Subsequently, the work table 21 is rotated by 180° so that the spray nozzle 20 is directed toward the internal side surface 1sb (the second internal side surface) opposite to the internal side surface 1sa. In this state, the conductive paste P is sprayed while the work table 21 is moved in the y direction. Accordingly, a thin film of the conductive paste P is also formed on the internal side surface 1sb. The above process is performed with respect to all the grooves 3.

Accordingly, the opposite internal side surfaces in the width direction of all the grooves 3 are covered with the conductive paste P. Because the conductive paste P is sprayed with a certain extent of dispersion, the upper surfaces 1u of the respective module components 1 are also covered with the conductive paste P by spraying the conductive paste P with respect to the groove 3 as a target as described above.

At the time of spraying the conductive paste P, it is preferable to spray the conductive paste P intermittently by pulse control. Accordingly, a requisite minimum thickness can be obtained, and a difference in the thickness of the conductive paste P between the upper surface 1u and the side surface 1s can be suppressed. Accordingly, cost reduction of the manufacturing process can be achieved. The pulse control need not be synchronized with the movement of the work table 21; however, it can be synchronized with the movement of the work table 21.

Returning back to FIG. 2, after spraying of the conductive paste P is complete, each of the module components 1 formed on one aggregate substrate is detached from the dicing tape 2 (Step S5). Accordingly, the respective module components 1 are separated from each other, thereby completing the module components 1 as a product.

When a portion of the aggregate substrate at the certain distance from the rear surface thereof is left without being diced, the remaining portion of the aggregate substrate can be diced at Step S5. Accordingly, the aggregate substrate can be completely cut, thereby enabling to separate the module components 1 as in the manner described above.

The overall concept of the manufacturing method of module components has been explained above. Characteristic parts of the present invention are explained below in detail.

According to the manufacturing method of module components according to the present invention, the angle θ is set so as to satisfy the following expression (2). Accordingly, the conductive paste can be formed preferably on the side surface of the module component 1. This point is explained below in detail.

$$\tan^{-1}(D/2w) \leq \theta \leq \tan^{-1}(2D/w) \qquad (2)$$

Figure 5A:
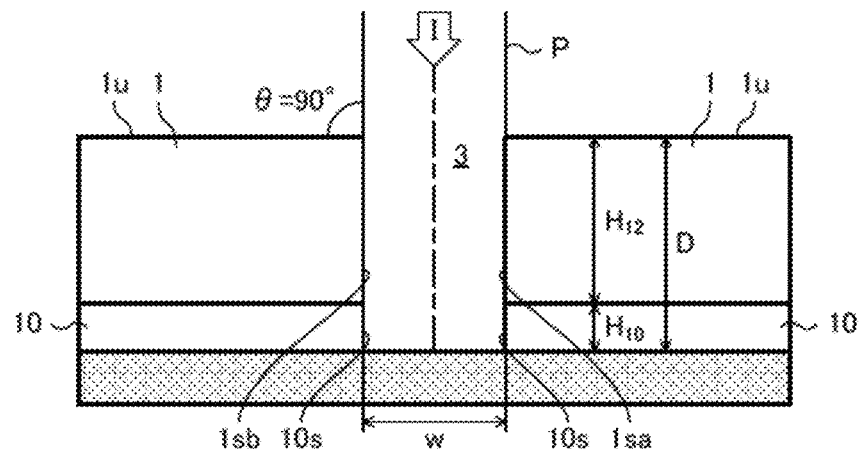
FIGS. 5A, 5B, and 5C show a relation between a groove provided between the module components in an aggregate substrate state and a spray direction I of the conductive paste, where

FIG. 5A shows the angle θ in the conventional manufacturing process. As shown in FIG. 5A, in the conventional manufacturing process, the conductive paste P is sprayed so that the angle θ becomes 90°. According to this spraying method, as described above, the conductive paste P adheres only to the upper part of the side surface 1s, and only a slight amount of conductive paste P reaches the lower part of the side surface 1s. As a result, when the aspect ratio (=D/w) of the groove 3 is high, the thickness of the conductive paste P is not sufficient in the lower part of the side surface 1s, as shown in the example of θ=90° shown in FIG. 6. In respective lateral photographs shown in FIG. 6, as the conductive paste P becomes thinner, the color thereof becomes darker. Therefore, in the lateral photograph in the case of θ=90°, it can be understood that the thickness of the conductive paste P in the lower part of the side surface 1s becomes thinner than that of the conductive paste P in the upper part of the side surface 1s.

Figure 5B:
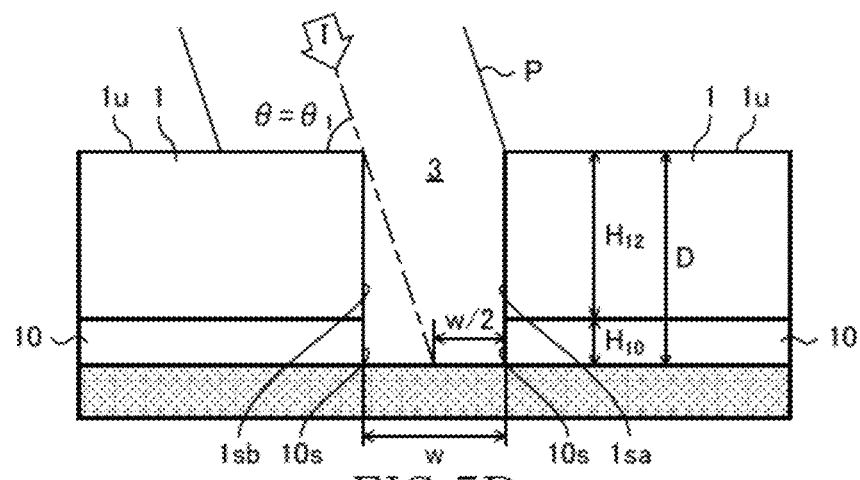
Figure 5C:
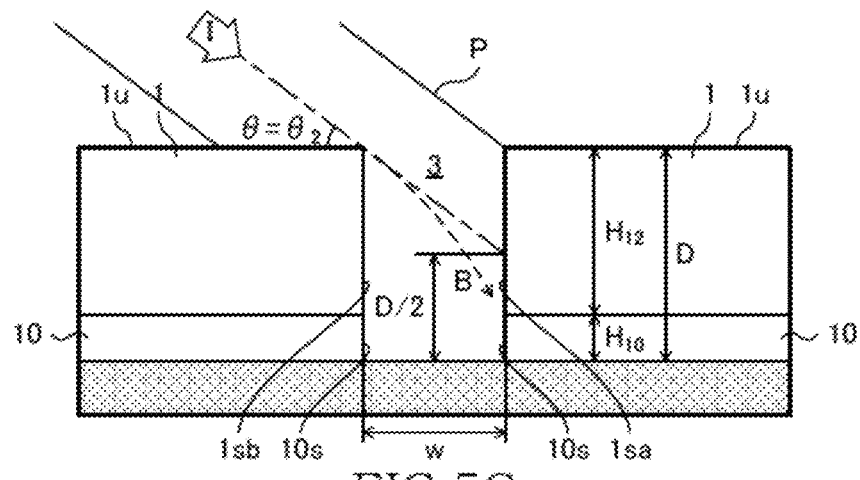

According to the present embodiment, the angle θ is set to be smaller than 90°, specifically, set to satisfy the above expression (2). FIG. 5B shows an example of a case where the angle θ becomes an upper limit $\theta_1 = \tan^{-1}(2D/w)$, and FIG. 5C shows an example of a case where the angle θ becomes a lower limit $\theta_2 = \tan^{-1}(D/2w)$. As is obvious from FIGS. 5B and 5C, as the angle θ becomes smaller, the angle of spraying the conductive paste P to the internal side surface 1sa (the internal side surface away from the spray nozzle 20) becomes sharp. As a result, the conductive paste P adheres to the lower part of the internal side surface 1sa preferably, thereby enabling to sufficiently secure the thickness of the conductive paste P in the lower part of the side surface 1s. However, it does not mean that it is better so long as the angle θ becomes smaller than 90°. When the angle θ is too close to 90°, it is substantially the same as the conventional case where the conductive paste P is sprayed with the angle θ of 90°, and the thickness of the conductive paste P in the lower part of the side surface 1s becomes insufficient. When the angle θ is too small, as is understood from FIG. 5C, the conductive paste P cannot reach the lower part of the internal side surface 1sa, and the thickness of the conductive paste P in the lower part of the side surface 1s becomes insufficient. Therefore, the angle θ has a preferable range between 0° to 90°. Specifically, by setting the angle θ so as to satisfy the above expression (2), the conductive paste P can preferably reach the lower part of the side surface 1s of each module component 1.

In the example shown in FIG. 5C, the end of the spray direction I of the conductive paste P does not reach the lower part of the internal side surface 1sa. However, the spray direction I is not actually a complete straight line, and is curved in a direction of an arrow B shown in FIG. 5C due to an influence of gravity. As a result, even when the angle θ is smaller than $\tan^{-1}(D/w)$ to some extent, the conductive paste P can preferably reach the lower part of the internal side surface 1sa, and the limit thereof becomes the lower limit $\theta_2 = \tan^{-1}(D/2w)$ described above.

Figure 6:
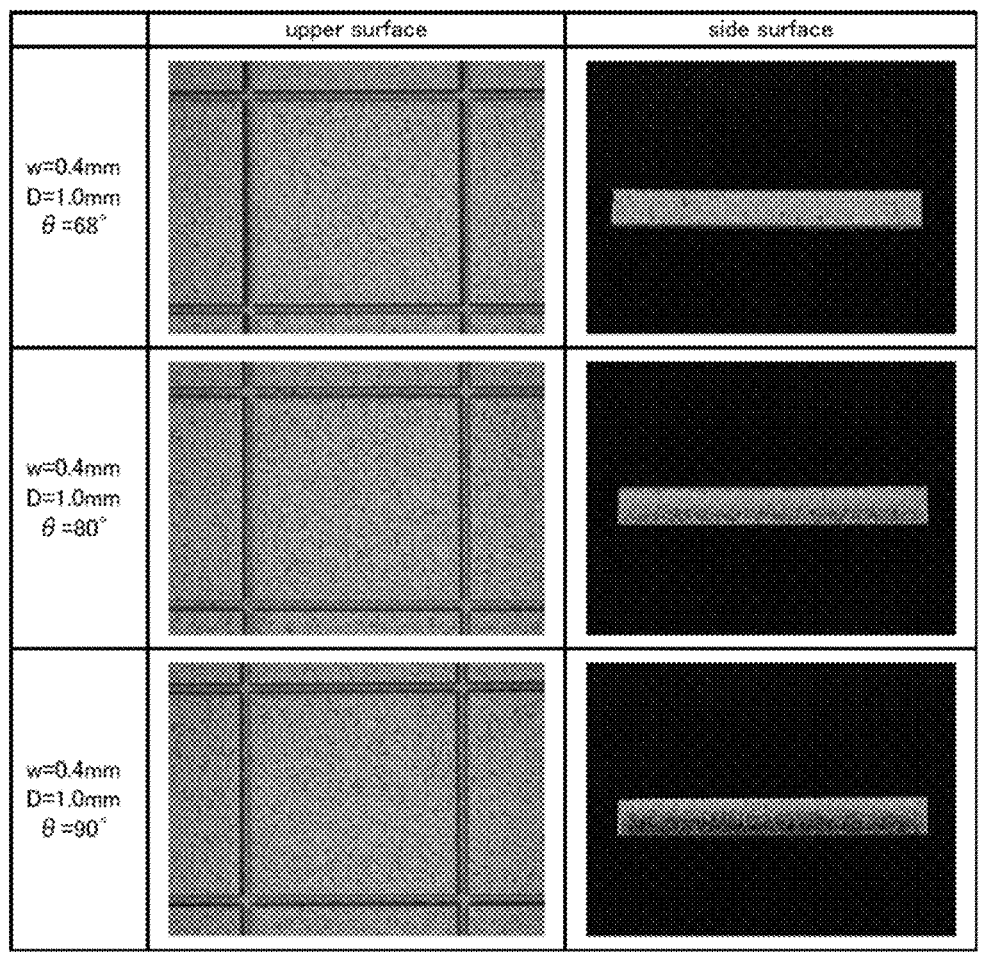
FIG. 6 shows photographs of an aggregate substrate taken from above after application of the conductive paste and photographs of the module component after separation, taken from the side when a spray angle θ is 68°, 80°, and 90°, in a case where a width and a depth of the groove are respectively 0.4 mm and 1.0 mm.

Referring back to FIG. 6, when the width w and the depth D of the groove 3 are respectively 0.4 mm and 1.0 mm, the upper limit $\theta_1$ of the angle θ becomes about 78.69°, and the lower limit $\theta_2$ of the angle $\theta$ becomes about 51.34°. Therefore, the example of $\theta=68°$ shown in FIG. 6 is an example of a case where the angle $\theta$ satisfies the above expression (2), and the example of $\theta=80°$ is an example of a case where the angle $\theta$ does not satisfy the above expression (2). As is understood from the lateral photographs shown in FIG. 6, in the example of $\theta=80°$, the thickness of the conductive paste P on the side surface 1s is not uniform, and particularly the thickness in the lower part of the side surface 1s is not sufficient. On the other hand, in the example of $\theta=68°$, the thickness of the conductive paste P on the side surface 1s is uniform. Therefore, it can be understood from this example also that the conductive paste P can reach even the lower part of the side surface 1s by setting the angle $\theta$ so as to satisfy the above expression (2).

Figure 7:
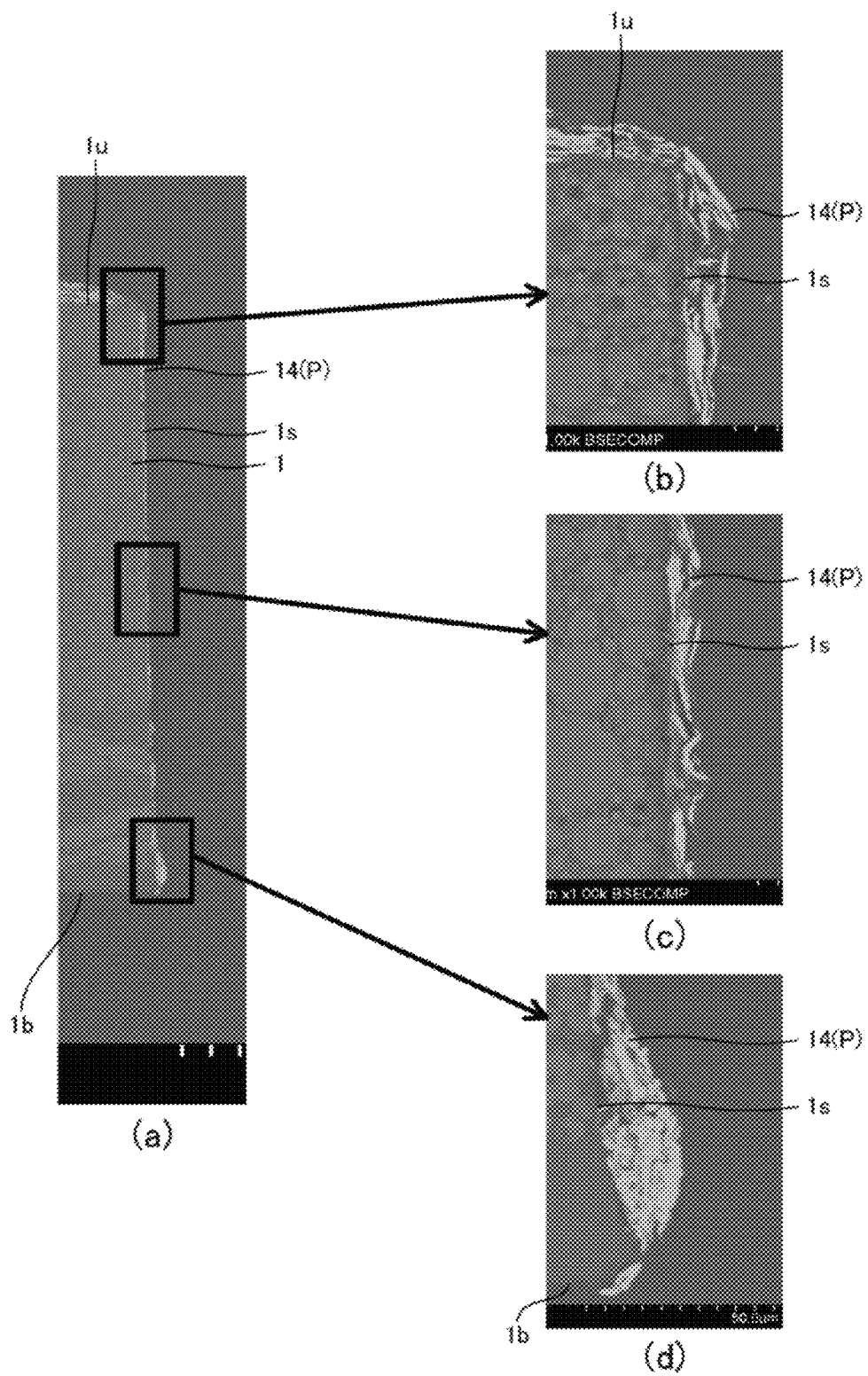
FIG. 7 is a cross-sectional photograph of the module component after separation when the width and the depth of the groove are respectively 0.4 mm and 1.0 mm and the spray angle θ is set to 68°.

Cross-sectional photographs of the module component 1 shown in FIG. 7 also show that the conductive paste P preferably reaches the lower part of the side surface 1s when the angle $\theta$ satisfies the above expression (2). The cross sectional photographs are obtained by cutting the module component 1 according to the example of $\theta=68°$ shown in FIG. 6 in a direction vertical to the side surface 1s and taking a picture of the cut surface. (a) of FIG. 7 shows the entire side surface from the upper surface 1u to the lower surface 1b, and (b) to (d) of FIG. 7 respectively show a portion near an upper end, near the center, and near a lower end of the side surface 1s in an enlarged view. As is obvious from these cross-sectional photographs, when the width w and the depth D of the groove 3 are respectively 0.4 mm and 1.0 mm, and the spray angle $\theta$ is set to 68°, that is, when the angle $\theta$ satisfies the above expression (2), the shield 14 (the conductive paste P) can be formed preferably even on the lower part of the side surface 1s.

Furthermore, as shown in FIG. 7, according to the manufacturing method of module components of the present embodiment, the conductive paste P near the upper end of the side surface 1s can be formed relatively thick. This can be considered to be a secondary effect by spraying the conductive paste P at an angle with respect to the groove 3. Therefore, according to the manufacturing method of module components of the present embodiment, electrical continuity can be established reliably between the conductive paste P formed on the upper surface 1u and the conductive paste P formed on the side surface 1s.

Further, according to the manufacturing method of module components of the present embodiment, the conductive paste P is formed continuously over the entire side surface 1s. Therefore, electrical continuity can be established reliably between the ground wiring line 13 and the conductive paste P, regardless of the exposed position of the ground wiring line 13 (FIG. 1).

It is apparent that the present invention is not limited to the above embodiments, but may be modified and changed without departing from the scope and spirit of the invention.

EXAMPLES

A conclusion obtained by actually manufacturing the module component 1 explained above while changing various conditions, and confirming the state of the shield 14 formed on the side surface 1s is explained below.

Specific constituent materials and manufacturing method of the module component 1 manufactured this time are explained first in detail. First, as an aggregate substrate, a substrate made of R-1515B being a substrate material made by Panasonic Corporation and having a thickness $H_{10}$ (FIG. 1) of 0.2 mm was used. Various wiring lines formed on the substrate 10 (FIG. 1) were formed on a surface of the aggregate substrate by patterning according to a subtractive method.

After formation of the various wiring lines, PFR®-800 AUS® 410 being a dry film made by TAIYO INK MFG. CO., LTD was laminated over the entire surface of the substrate, sequentially followed by exposure, development, and post-curing, thereby forming a solder-resist pattern. Subsequently, heat-resistant OSP (Organic Solder ability Preservative) was applied to a surface of a copper land exposed by this pattern by using a corrosion-resistant agent made by SHIROKU CHEMICALS CORPORATION. Thereafter, M705 cream solder being Sn/Ag solder made by Senju Metal Industry Co., Ltd. was printed thereon. After mounting the chip components 11 (FIG. 1) having a size of 0603 to 2520 by using a mounter, a reflow process was performed at a temperature of 260° C. at maximum, thereby bonding the chip components 11 onto the substrate 10.

Subsequently, after a flux contained in the surface of the substrate 10 and in the solder was removed by washing, the mold 12 (FIG. 1) was formed according to a compression molding method, and post-curing was performed under predetermined curing conditions. As the material of the mold 12, CV8710TAC being a molding material for IC/LSI made by Panasonic Corporation (a material having a cut point of 30 μm or less and including a filler having an average grain diameter of 6 μm) was used. The mold 12 was molded under conditions recommended by the manufacturer, and the mold thickness $H_{12}$ (FIG. 1) was set to three types of 0.7 mm, 0.9 mm, and 1.1 mm.

After formation of the mold 12, the grooves 3 extending respectively in the x direction and the y direction (FIG. 3) were formed with a cat depth of the mold thickness $H_{12}$+0.1 mm by using a dicer having a blade thickness of 0.4 mm. Accordingly, the groove 3 having a width w of 0.4 mm and a depth D of 0.8 mm, 1.0 mm, or 1.2 mm according to the thickness $H_{12}$ of the mold 12 was formed between the respective module components 1. The pitch of the groove 3 is 10.4 mm.

After formation of the groove 3, the module components 1 in an aggregate substrate state were placed on the work table 21 shown in FIG. 4, and the conductive paste P (FIG. 4) was sprayed from the spray nozzle 20. In this case, it was configured so that the conductive paste P was formed uniformly over the entire internal side surface of the groove 3 by intermittently spraying the conductive paste P by pulse control, while moving the work table 21. As the material of the conductive paste P, a material in which a conductive paste SP-1300A made by Sumitomo Electric Industries, Ltd. was diluted by methyl ethyl ketone was used. As the spray nozzle 20 (FIG. 4), an NCG nozzle made by Nordson KK was used. The distance L (FIG. 4B) between the spray nozzle 20 and the upper surface 1u was set to 36 mm, and a sweep speed of the work table 21 was set to 45 mm/sec. After completion of spraying of the conductive paste P, the conductive paste P was cured under conditions recommended by the manufacturer, and the module components 1 were separated from each other.

In the experiments performed this time, ten samples of the module component 1 respectively having each of six types of angles $\theta$ were prepared for each of three types of depths D of the groove 3 (0.8 mm, 1.0 mm, and 1.2 mm described above). By visually confirming the respective side surfaces 1s, the state of the shield 14 (the conductive paste P) was evaluated. As for evaluation standards, there were three stages such that when formation of the shield 14 on the side surface 1s was sufficient in any of the ten samples, the module component was marked as "○", when formation of the shield 14 on the side surface 1s was sufficient in a part of the ten samples but was insufficient in the rest of the samples, the module component was marked as "Δ", and when formation of the shield 14 on the side surface 1s was insufficient in any of the ten samples, the module component was marked as "x".

Table 1 shows evaluation results when the depth D is 0.8 mm. In this case, the aspect ratio of the groove 3 (=D/w) is 2.0, the upper limit $\theta_1$ of the angle θ, $\theta\theta_1$=tan⁻(2D/w) becomes about 75.96°, and the lower limit $\theta_2$ of the angle θ, $\theta_2$=tan⁻¹(D/2w) becomes about 45.00°. It can be understood from the evaluation results of the six types of samples 1 to 6 shown in Table 1 that when the angle θ is from $\theta_1$ to $\theta_2$ inclusive, favorable results can be obtained, otherwise favorable results cannot be obtained.

TABLE 1

| Sample | θ | Evaluation |
|---|---|---|
| 1 | 36.9° | Δ |
| 2 | 45.0° | ○ |
| 3 | 63.4° | ○ |
| 4 | 76.0° | ○ |
| 5 | 82.9° | Δ |
| 6 | 90.0° | x |

Table 2 shows evaluation results when the depth D is 1.0 mm. In this case, the aspect ratio of the groove 3 (=D/w) is 2.5, the upper limit $\theta_1$ of the angle θ, $\theta_1$=tan⁻¹(2D/w) becomes about 78.69°, and the lower limit $\theta_2$ of the angle θ, $\theta_2$=tan⁻¹(D/2w) becomes about 51.34°. Table 2 also shows actual measurement results of the maximum thickness of the shield 14 at three points shown in (b) to (d) of FIG. 7 (near the upper end, near the center, and near the lower end of the side surface 1s). The unit of the actual measurement results is μm. It can be understood from the evaluation results of the six types of samples 7 to 12 and the actual measurement results of the maximum thickness shown in Table 2 that when the angle θ is from $\theta_1$ to $\theta_2$ inclusive, favorable results can be obtained, otherwise favorable results cannot be obtained.

TABLE 2

| Sample | θ | Evaluation | near the upper end | near the center | near the lower end |
|---|---|---|---|---|---|
| 7 | 45.0° | x | 13 | 0 | 2 |
| 8 | 51.3° | ○ | 12 | 4 | 3.5 |
| 9 | 68.2° | ○ | 10 | 5 | 7 |
| 10 | 78.7° | ○ | 7 | 4 | 4.5 |
| 11 | 84.3° | x | 4 | 0 | 1 |
| 12 | 90.0° | x | 10 | 0 | 0 |

Table 3 shows evaluation results when the depth D is 1.2 mm. In this case, the aspect ratio of the groove 3 (=D/w) is 3.0, the upper limit $\theta_1$ of the angle θ, $\theta_1$=tan⁻¹(2B/w) becomes about 80.54°, and the lower limit $\theta_2$ of the angle θ, $\theta_2$=tan⁻¹(D/2w) becomes about 56.31°. It can be also understood from the evaluation results of the six types of samples 13 to 18 shown in Table 3 that when the angle θ is from $\theta_1$ to $\theta_2$ inclusive, favorable results can be obtained, otherwise favorable results cannot be obtained.

TABLE 3

| Sample | θ | Evaluation |
|---|---|---|
| 13 | 45.0° | x |
| 14 | 51.3° | ○ |
| 15 | 68.2° | ○ |
| 16 | 78.7° | ○ |
| 17 | 84.3° | x |
| 18 | 90.0° | x |

As described above, as a result of the experiments, by using the angle θ within the range shown by the expression (2), it was confirmed that favorable results can be obtained regardless of the depth D of the groove 3 and the value of the aspect ratio.

What is claimed is:

1. A manufacturing method of electronic module components comprising:
    forming a plurality of module components on a principal surface of a substrate;
    forming a groove by dicing between the module components;
    spraying a conductive paste toward the principal surface of the substrate; and
    separating the module components,
    wherein the spraying is performed so that an angle formed between a spray direction and the principal surface is an angle θ, and
    wherein the angle θ is set so as to satisfy the following expression (1), assuming that a depth of the groove is D and a width of the groove is w.

$$\tan^{-1}(D/2w) \leq \theta \leq \tan^{-1}(2D/w) \quad (1)$$

2. The manufacturing method of electronic module components as claimed in claim 1, wherein
    the groove includes a first internal side surface and a second internal side surface opposite to the first internal side surface, and
    the spraying includes:
        spraying the conductive paste toward the first internal side surface of the groove; and
        spraying the conductive paste toward the second internal side surface of the groove.

3. The manufacturing method of electronic module components as claimed in claim 1, wherein
    each of the module components has a ground wiring line including an end exposed on a lower part of a side surface, and
    the conductive paste is electrically connected to the ground wiring line through the end.

4. The manufacturing method of electronic module components as claimed in claim 3, wherein
    each of the module components has four side surfaces, and
    the ground wiring line is formed so as to be exposed on at least one of the four side surfaces of a corresponding one of the module components.

5. The manufacturing method of electronic module components as claimed in claim 1, further comprising adhering a dicing tape onto a rear surface of the substrate before the forming the groove,
    wherein the separating is performed by detaching the module components from the dicing tape.

6. The manufacturing method of electronic module components as claimed in claim 3, wherein the forming the groove is performed so that the ground wiring line is exposed on the side surface and so that a part of the substrate is left in an uncut state, and the separating is performed by cutting the part of the substrate that has not been cut at the forming the groove.

7. The manufacturing method of electronic module components as claimed in claim 1, wherein the conductive paste is sprayed intermittently by pulse control.

8. The manufacturing method of electronic module components as claimed in claim 1, wherein the spraying is performed so that the angle θ is fixed.

* * * * *